US012772608B2

(12) United States Patent
Xu et al.

(10) Patent No.: US 12,772,608 B2
(45) Date of Patent: Oct. 20, 2026

(54) MICRO LED STRUCTURE AND MICRO LED PANEL

(71) Applicant: Hue Inc., Shanghai (CN)

(72) Inventors: Qunchao Xu, Shanghai (CN); WeiSin Tan, Shanghai (CN)

(73) Assignee: Hue Inc., Shanghai (CN)

( * ) Notice: Subject to any disclaimer, the term of this patent is extended or adjusted under 35 U.S.C. 154(b) by 0 days.

(21) Appl. No.: 18/694,411

(22) PCT Filed: Mar. 30, 2023

(86) PCT No.: PCT/CN2023/085127
§ 371 (c)(1),
(2) Date: Mar. 22, 2024

(87) PCT Pub. No.: WO2024/197711
PCT Pub. Date: Oct. 3, 2024

(65) Prior Publication Data

US 2026/0156972 A1 Jun. 4, 2026

(51) Int. Cl.
*H10H 20/813* (2025.01)
*H10H 29/24* (2026.01)

(52) U.S. Cl.
CPC ........ *H10H 20/8131* (2025.01); *H10H 29/24* (2025.01)

(58) Field of Classification Search
CPC .... H10H 20/8131; H10H 29/24; H10H 20/00; H10H 20/032; H10H 29/00; H10H 29/922; H10H 29/962; H10W 90/20; H10W 90/24; H10W 90/28; H10W 90/297; H10W 90/701
See application file for complete search history.

(56) References Cited

U.S. PATENT DOCUMENTS 12,641,941 B2 * 5/2026 Li .......................... H10H 29/10
2021/0384182 A1 * 12/2021 Xu ....................... H10H 20/835
2022/0320176 A1 * 10/2022 Jang ...................... H10H 20/01

FOREIGN PATENT DOCUMENTS

CN 110785841 A 2/2020
CN 111180479 A 5/2020
CN 111524926 A 8/2020
CN 114793476 A 7/2022
CN 115836341 A 3/2023
CN 115843389 A 3/2023

OTHER PUBLICATIONS

International Search Report and Written Opinion in counterpart PCT Application No. PCT/CN2023/085127, dated Dec. 20, 2023.

* cited by examiner

*Primary Examiner* — Anne M Hines
*Assistant Examiner* — Jose M Diaz
(74) *Attorney, Agent, or Firm* — FINNEGAN, HENDERSON, FARABOW, GARRETT & DUNNER LLP

(57) ABSTRACT

A full color micro LED structure is disclosed. The micro LED structure comprises an IC back plane, at least three mesa structures stacked along a vertical axis, and a final conductive layer formed above the at least three mesa structures. The layers may have cut-outs to accommodate vias so that the structure may have a small footprint. Multiple micro LED structures may create an array by connecting their final conductive layer, forming a trench between the adjacent micro LED structures.

23 Claims, 5 Drawing Sheets

MICRO LED STRUCTURE AND MICRO LED PANEL

The present disclosure claims the benefits of priority to PCT Application No. PCT/CN2023/085127, filed on Mar. 30, 2023, titled "Micro LED Structure and Micro LED Panel," which is incorporated herein by reference in its entirety.

FIELD OF THE DISCLOSURE

The present disclosure generally relates to micro light-emitting diode (LED) technology and, more particularly, to a micro LED structure and a full color micro LED panel using the micro LED structure.

BACKGROUND OF THE DISCLOSURE

Inorganic micro light-emitting diodes are also called "micro LEDs." They are increasingly important because of their use in various applications including, for example, self-emissive micro-displays, visible light communications, and opto-genetics. The micro LEDs have greater output performance than conventional LEDs, due to better strain relaxation, improved light extraction efficiency, uniform current spreading, etc. Moreover, compared with the conventional LEDs, the micro LEDs have improved thermal effects, improved operation at higher current density, better response rate, greater operating temperature range, higher resolution, higher color gamut, higher contrast, lower power consumption, etc.

A micro LED panel is manufactured by integrating an array of thousands or even millions of micro LEDs with a driver circuitry back panel. Each pixel of the micro LED panel is formed by one or more micro LEDs. The micro LED panel can be a mono-color or multi-color panel. In particular, for a full color LED panel, each pixel may further include multiple sub-pixels respectively formed by multiple micro LEDs, each of which corresponds to a different color. For example, three micro LEDs respectively corresponding to red, green, and blue colors may be superimposed to form one pixel. The different colors can be mixed to produce a broad array of colors.

The existing micro LED technology, however, faces several challenges. For example, one challenge is to reduce the pixel size so that more pixels can fit into the same display area. For full color micro LEDs, the pixel size is further determined by the sizes of the sub-pixels, as well as how they are arranged in the space. Thus, it is desirable to develop micro LED structures that can efficiently arrange the sub-pixels in a pixel.

BRIEF SUMMARY OF THE DISCLOSURE

The present disclosure provides a micro LED structure that addresses the problems in the related art, such as the problems described above. In particular, the disclosed micro LED structure integrates three vertically stacked micro LEDs, by placing them at different layers of the micro LED structure and electrically connecting them to an integrated circuit (IC) back panel. The micro LED structure effectively enhances the light illumination efficiency within a single pixel area, and at the same time, improves the resolution of the micro LED panel.

Moreover, the disclosed micro LED structure further improves the light illumination efficiency by including reflection layers that not only effectively increase the amount of light emitted by each of the vertically stacked micro LEDs, but also reduce crosstalk between the vertically stacked micro LEDs.

Consistent with the disclosed embodiments, a plurality of the disclosed micro LED structures can be arranged in a micro LED array to form a micro LED panel. Each of the plurality of micro LED structures corresponds to a pixel of the disclosed micro LED structure, and the multiple vertically stacked micro LEDs in a pixel correspond to multiple sub-pixels respectively.

Consistent with the disclosed embodiments, each layer of the disclosed micro LED structures may have an otherwise simple shape with one or more cut-outs as needed to allow passing of a via. The arrangement may reduce the footprint of the micro LED structure and thus result in higher resolution of the LED panel.

In some embodiments, the disclosed micro LED structure comprises an IC back plane, at least three mesa structures stacked along a vertical axis, and a final conductive layer formed above the at least three mesa structures.

In some embodiments, the at least three mesa structures comprises a first mesa structure formed on the IC back plane, a second mesa structure formed on the first mesa structure, and a third mesa structure formed on the second mesa structure.

In some embodiments, there may be a dielectric layer between the two adjacent mesa structures. The dielectric layers may bond the two adjacent mesa structures together. The dielectric layers may be made of silicon dioxide ($SiO_2$), silicon mononitride (SiN), silicon oxynitride (SiON), silicon carbon nitride (SiCN), titanium dioxide ($TiO_2$), or aluminum oxide ($Al_2O_3$).

In some embodiments, each of the three mesa structures comprises, from bottom up, a bottom conductive layer, a light emitting layer, and an optional top conductive layer. Each of these layers may have cut-outs. The top and bottom conductive layers may be a film made of transparent conductive oxide (TCO), e.g., indium tin oxide (ITO), aluminum-doped zinc oxide (AZO), antimony-doped tin oxide (ATO), or fluorine-doped tin oxide (FTO).

In some embodiments, the top side of the light emitting layers may each have a top-contact, through which electrically connecting the respective light emitting layer to the final conductive layers. The top-contact may be an N-type contact or a P-type contact.

In some embodiments, the top-contact may be disposed on top of the light emitting layer. In some embodiments, the top-contact may be disposed on top of a top conductive layer. In some embodiments, the top-contact may be disposed on the bottom of a top conductive layer.

In some embodiments, the second and third mesa structures may each optionally have a top conductive layer.

In some embodiments, the bottom conductive layer of the first mesa structure may be electrically connected to the IC back plane through a pad. The bottom conductive layers of the second and third mesa structures may each electrically connected to the IC back plane through a pad.

In some embodiments, the conductive layers may have a first conductive type, and the second and third semiconductor layers have a second conductive type.

In some embodiments, each of the light emitting layers comprises a P-type semiconductor layer, an N-type semiconductor layer, and a quantum well layer between the P-type semiconductor layer and the N-type semiconductor layer. For example, each of the light emitting layers may comprise a P-type semiconductor layer at the bottom and an N-type semiconductor layer on the top, thereby forming a P-N junction; or alternatively, each of the light emitting layers may comprise an N-type semiconductor layer on the bottom and a P-type semiconductor layer on the top, thereby forming an N-P junction.

In some embodiments, the adjacent micro LED structures in the LED panel may have their final conductive layers connected and form a trench. The formed trench is positioned between the adjacent micro LED structures, and may have its bottom surface lower than or at least level with the top surface of the first light emitting layer.

DETAILED DESCRIPTION OF THE EMBODIMENTS

Reference will now be made in detail to exemplary embodiments to provide a further understanding of the disclosure. The specific embodiments and the accompanying drawings discussed are merely illustrative of specific ways to make and use the disclosure, and do not limit the scope of the disclosure or the appended claims.

Figure 1:
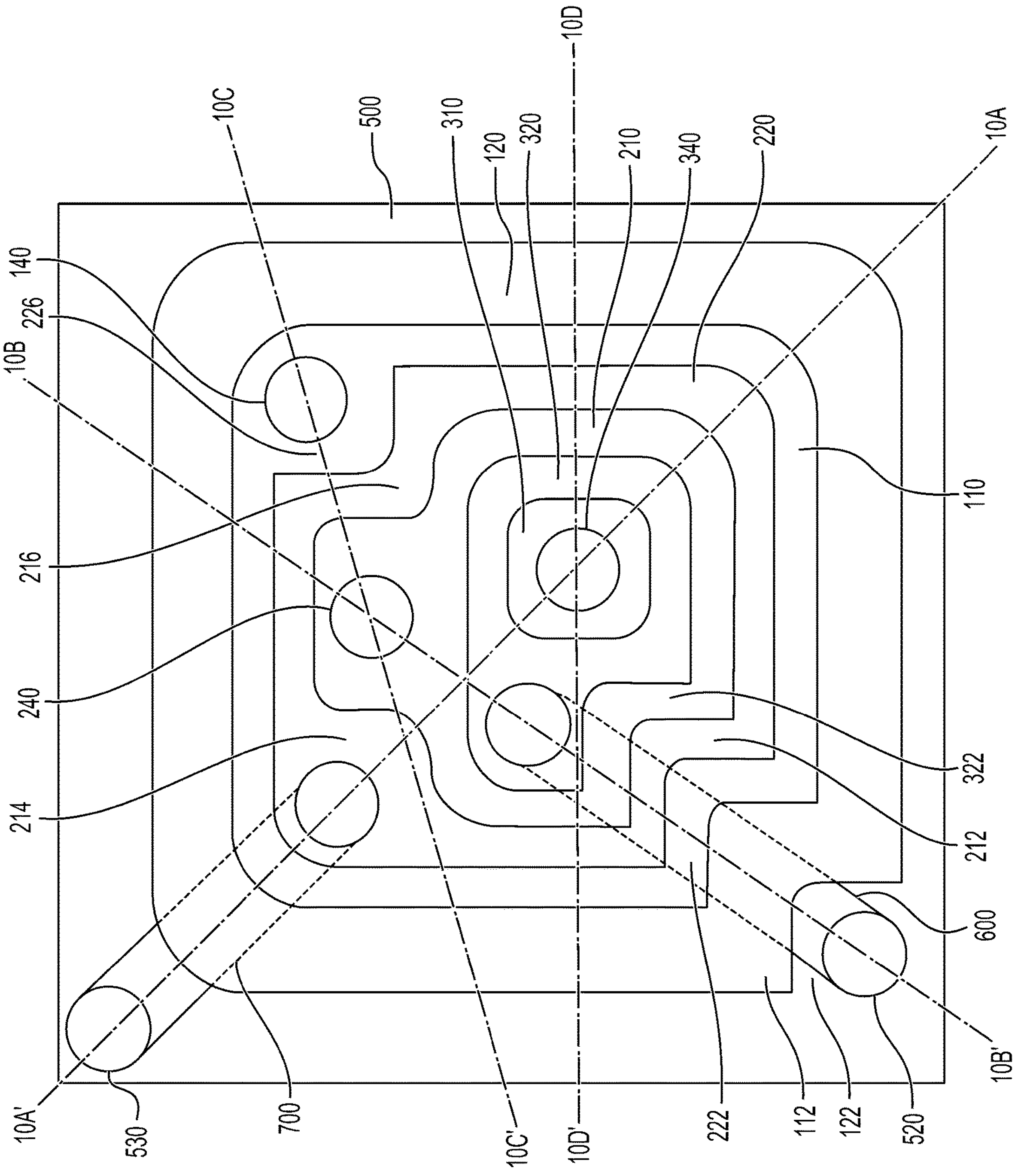
FIG. 1 is a plan view of a micro LED structure, according to some embodiments of the present disclosure.
Figure 2A:
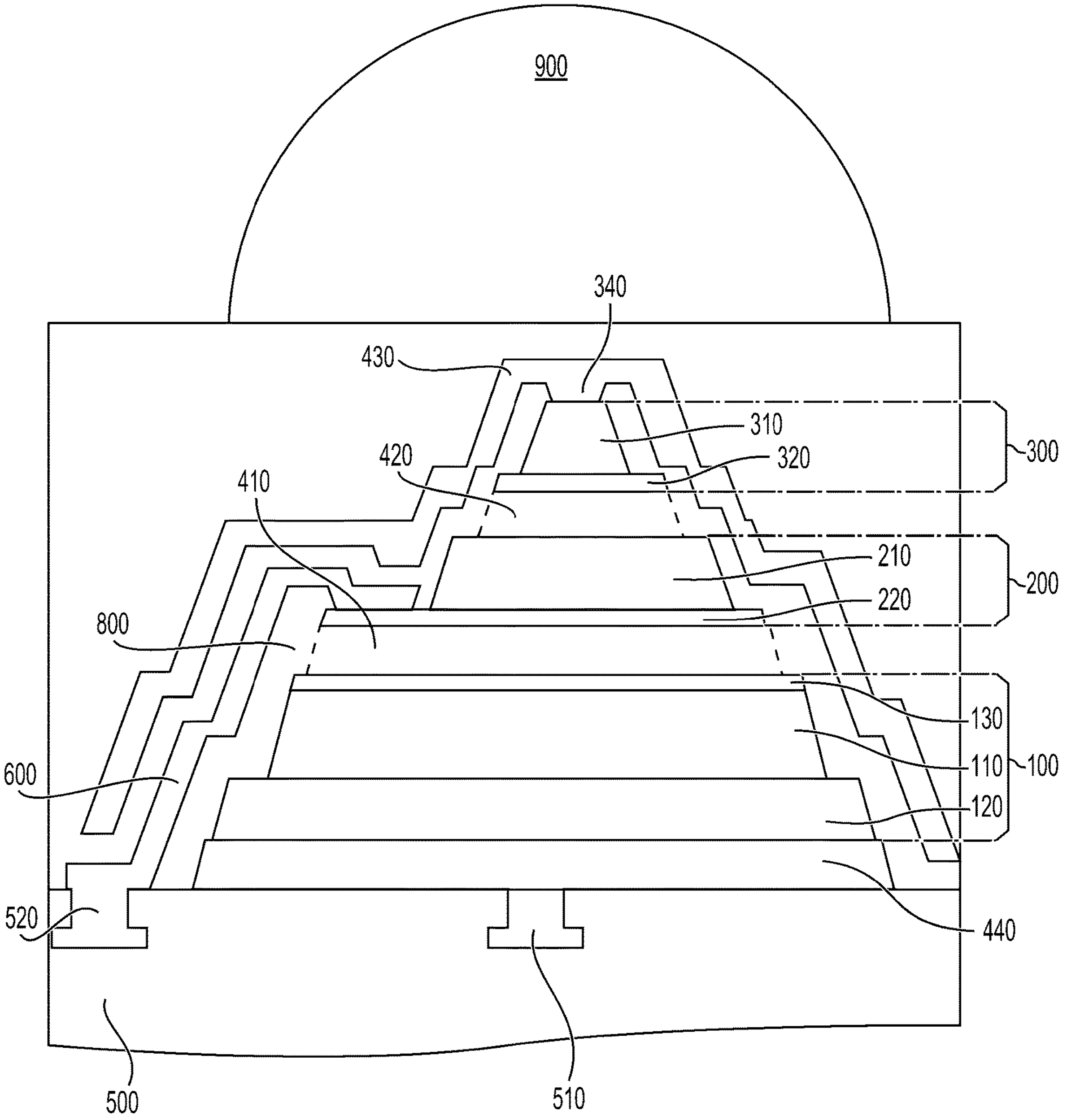
FIG. 2A-2C are cross-sectional views of the micro LED structure in FIG. 1 at different cross-sections, according to some embodiments of the present disclosure.
Figure 2B:
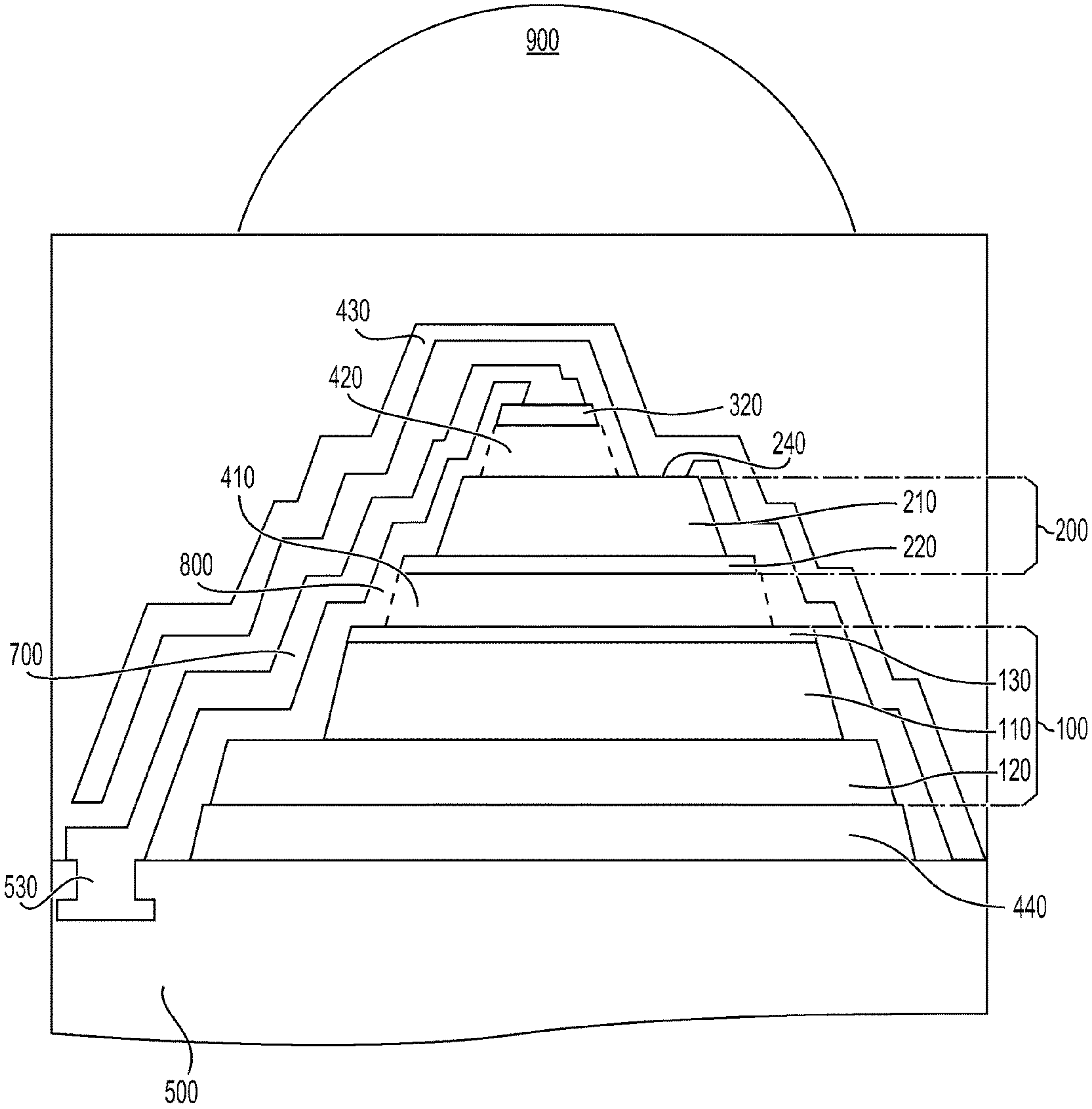
Figure 2C:
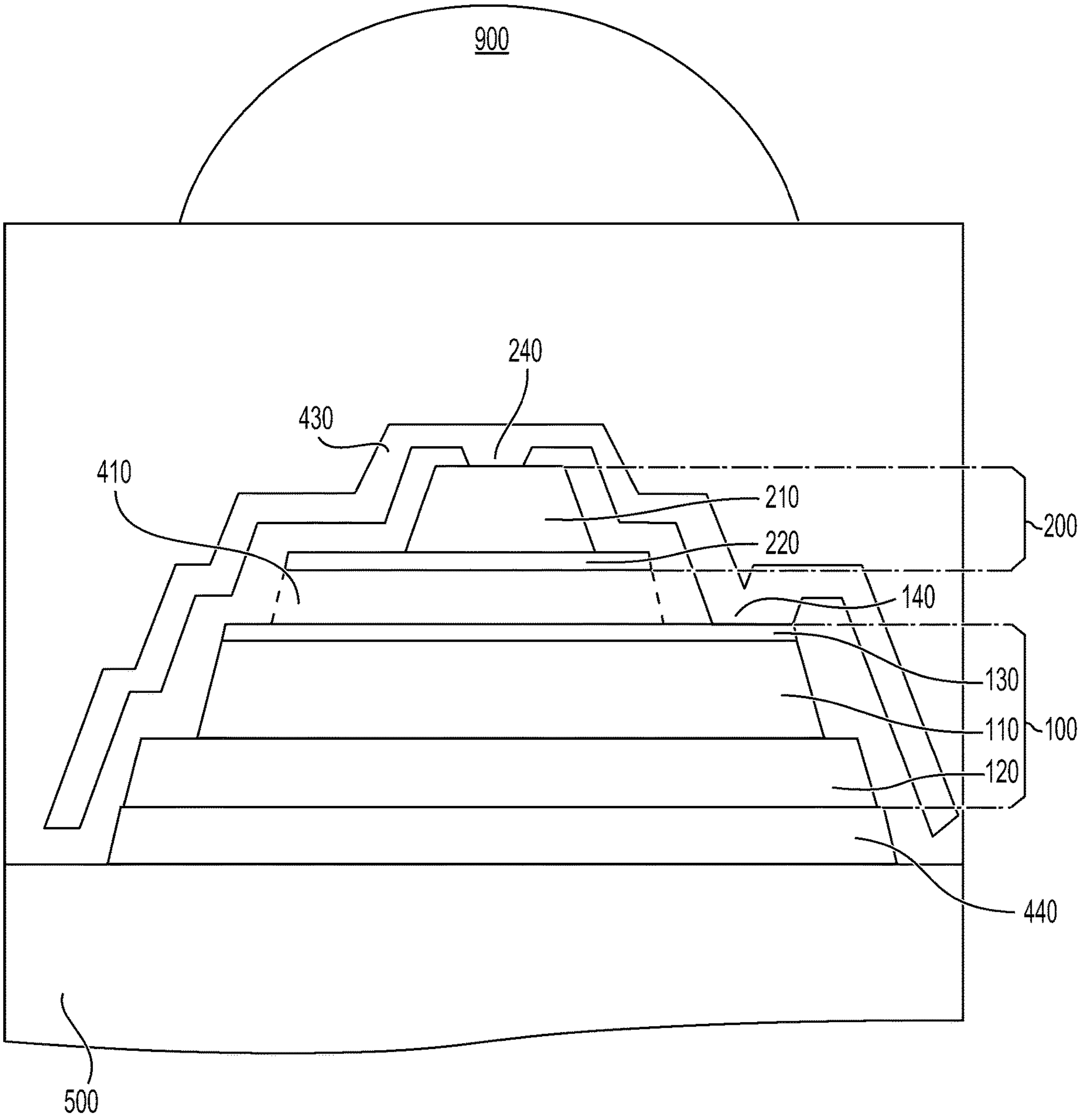

FIG. 1 is a plan view of a micro LED structure 10, according to some embodiments of the present disclosure. FIGS. 2A-2C are cross-sectional views of the micro LED structure 10 respectively taken along the lines 10A-10A', 10B-10B's, and 10C-10C' in FIG. 1.

Specifically, FIG. 2A is a cross sectional view of the micro LED structure 10 taken along the line 10A-10A' in FIG. 1, according to some embodiments of the present disclosure. As shown in FIG. 2A, the micro LED structure 10 comprises an IC back plane 500 having at least three pads 510, 520, 530 (530 is not shown in FIG. 2A but is shown in FIG. 1) and at least three mesa structures 100, 200, 300 stacked along a vertical axis. In some embodiments, the at least three mesa structures comprises, from bottom to top, a first mesa structure 100 formed on the IC back plane 500, a second mesa structure 200 formed on the first mesa structure 100, and a third mesa structure 300 formed on the second mesa structure 200. In some embodiments, a first dielectric layer 410 may be formed between the first mesa structure 100 and the second mesa structure 200; a second dielectric layer 420 may be formed between the second mesa structure 200 and the third mesa structure 300.

In some embodiments, each of the at least three mesa structures may comprise, from bottom to top, a bottom conductive layer, a light emitting layer, and an optional top conductive layer. Each of the layers may have an otherwise substantially regular shape (e.g., round, rectangular with or without rounded corners, etc.) with cut-outs. For example, the first mesa structure 100 comprises a first light emitting layer 110 having a first cut-out 112, a first bottom conductive layer 120 having a first cut-out (not shown), and a first top conductive layer 130 having a first cut-out (not shown); the second mesa structure comprises a second light emitting layer 210 having a first cut-out 212, a second cut-out 214, and a third cut-out 216, and a second bottom conductive layer 220 having a first cut-out 222 and a second cut-out 226, the third mesa structure 300 comprises a third light emitting layer 310 and a third bottom conductive layer 320 having a first cut-out 322. In some embodiments, a final conductive layer 430 covers all of the at least three mesa structures.

In some embodiments, the top side of the light emitting layers may each have a top-contact, through which electrically connecting the respective light emitting layer to the final conductive layer 430. The top-contact may be an N-type contact or a P-type contact.

In some embodiments, the top-contact may be disposed on top of the light emitting layer. For example, a top-contact 340 is disposed on top of the third light emitting layer 300, connecting a top side of the third light emitting layer 300 to the final conductive layer 430; a top-contact 240 (as shown in FIG. 2B) is disposed on top of the second light emitting layer 200, connecting a top side of the second light emitting layer 200 to the final conductive layer 430.

In some embodiments, the top-contact may be disposed on top of a top conductive layer. For example, as shown in FIG. 2C, a top-contact 140 is disposed on top of the first top conductive layer 130, connecting a top side of the first light emitting layer 100 to the final conductive layer 430.

In some embodiments, the at least three pads are each connected to a conductive layer. For example, a first pad 510 of the at least three pads of the IC back plane 500 is electrically connected with the first bottom conductive layer 120; a second pad 520 of the at least three pads of the IC back plane 500 is electrically connected with the second bottom conductive layer 220 through a first via; a third pad 530 of the at least three pads of the IC back plane 500 is electrically connected with the third bottom conductive layer through a second via 700.

In some embodiments, the first bottom conductive layer 120 may be a bottom bonding layer bonding the first light emitting layer 110 to the IC back plane 500. In some embodiments, the first bottom conductive layer 120 may be boned to the IC back plane 500 by an additional bonding layer 440. In some embodiments, the bonding layer 440 may be a metal bonding layer.

Referring back to FIG. 1. When vertically projecting the layers of the micro LED structure onto a horizontal plane, each of the layers forms a projective area on the horizontal plane. Each projective area on the horizontal planes has an outline, which is herein referred to as projective outline in plan view (i.e., top view). In some embodiments, the disclosed micro LED structure 10 is configured to make an upper light emitting layer's projective outline in plan view located within a lower light emitting layer's projective shape in plan view, thereby forming multiple mesa structures with different widths. The top conductive layer 430 may cover all three mesa structures. In some embodiments, an upper layer's projective outline in plan view may be substantially located within a lower layer's projective shape in plan view, i.e., the upper layer's projective outline in plan view may be located within the lower layer's projective shape.

More specifically, in some embodiments, the projective outline of the light emitting layer 310 is located within the projective outline of the third bottom conductive layer 320; the projective outline of the light emitting layer 210 is located within the outline of the second bottom conductive layer 220, and the projective outline of the first light emitting layer 110 is located within the projective outline of the first bottom conductive layer 120.

In some embodiments, the top connecting layers may be optional. When having the top connecting layers, the projective outline of the top connecting layers may be the same as, or only slightly smaller than, that of the light emitting layer immediately below it. For example, the top conductive layer 130 may have a projective outline overlapping with the projective outline of the first light emitting layer 110, or more precisely, the top conductive layer 130 may have a projective outline only slightly smaller than the projective outline of the first light emitting layer 110 due to the inclining sidewalls, which will be discussed further in detail in later sections.

In some embodiments, the first bottom conductive layer 120, the first light emitting layer 110, the first top conductive layer 130, the first dielectric layer 410, the second bottom conductive layer 220, the second light emitting layer 210, the second dielectric layer 420, the third bottom conductive layer 320, and the third light emitting layer 310 all have an otherwise regular shape (e.g., round, oval, rectangular with or without rounded corners, etc.) with cut-outs.

More generally, as shown in FIG. 2A-2C, comparing any two of the layers, i.e., the first bottom conductive layer 120, the first light emitting layer 110, the first top conductive layer 130, the first dielectric layer 410, the second bottom conductive layer 220, the second light emitting layer 210, the second dielectric layer 420, the third bottom conductive layer 320, and the third light emitting layer 310, a first outline in plan view formed by an upper layer may be disposed within a second outline in plan view formed by a lower layer.

In some embodiments, a sidewall of an upper layer is retracted from a sidewall of its adjacent lower layer by an offset. As shown in FIGS. 2A-2C, the sidewalls of each layer of the micro LED structure may be aligned to an inclined straight line from a side view with occasional steps. In some exemplary embodiments, each of the first dielectric layer, the second bottom conductive layer, the second light emitting layer, the second dielectric layer, the third bottom conductive layer, and the third light emitting layer comprises a sidewall that is aligned to a substantially straight line in a side view, the substantially straight line being inclined at an angle. In some exemplary embodiments, the layers may have a substantially rectangular shape with cut-outs. The micro LED structure may, therefore, have four sides, each has the edges of the layers incline at an angle. The angle may or may not be consistent for all four edges.

In some embodiments, the vias (i.e., 600, 700) may be disposed and accommodated in the cut-outs. For example, the first via 600 electrically connects the second pad 520 and the second bottom conductive layer 220, and passes the second light emitting layer 210 in its second cut-out 214; the second via 700 electrically connects the third pad 530 to the third bottom conductive layer 320 from its top side, and passes the first bottom conductive layer 120 in its first cut-out 122, the first light emitting layer 110 in its first cut-out 112, the first top conductive layer in its first cut-out (not shown in FIG. 1), the second bottom conductive layer 220 in its first cut-out 222, the second light emitting layer 210 in its first cut-out 212, and the third bottom conductive layer 320 in its first cut-out 322.

In some embodiments, the top-contacts may also be disposed and accommodated in the cut-outs. For example, the top-contact 140 is disposed in the third cut-out 226 of the first light emitting layer 110 and the second cut-out 216 of the second bottom connecting layer 220. It is worth noting that because top-contacts connect the respective light emitting layer to the final conductive layer disposed above the respective light emitting layer, and because the upper layers always have a smaller projective outline than the layers below them, top-contacts do not always need to be disposed in cut-outs to achieve the goal of having a smaller LED structure footprint.

In some embodiments, vias (i.e., 600, 700) and the final conductive layer 430 may incline at the rate of its adjacent sides of the micro LED structure. In other words, as shown in FIGS. 2A-2C, the vias (e.g., the first via 600, the second via 700) and the final conductive layer 430 may each be at a same distance away from a layer of the micro LED structure at its height.

In some embodiments, sidewalls of the first dielectric layer 410, the second bottom conductive layer 220, the second light emitting layer 210, the second dielectric layer 420, and the third bottom conductive layer 320 are all inclined. In some embodiments, the sidewalls may be inclined at a same rate with the adjacent via.

Continuing referring to FIG. 1A, in some embodiments, dielectric material 800 may be filled around the mesa structures. In some embodiments, the dielectric material 800 may fill in the gaps of the micro LED structure 10, thereby isolating the light emitting layers (e.g., the light emitting layers 100, 200, 300) from being electrically connected with each other. In some embodiments, the dielectric material 800 may also fill in gaps between the vias and the structural layers (i.e., the conductive layers and the light emitting layers,) as well as the gaps between the final conductive layer 430 and the structural layers (i.e., the conductive layers and the light emitting layers.)

In some embodiments, the light emitting layers 110, 210, 310 may emit light or light images in different colors. In some exemplary embodiments, the light emitting layer 110 is chosen as a red color light emitting layer, the light emitting layer 210 is chosen as a green color light emitting layer, and the light emitting layer 310 is chosen as a blue color light emitting layer. The above color assignment is for illustrative purpose only. Consistent with the disclosed embodiments, other combinations of light colors may be assigned to the light emitting layers to obtain any needed result.

In some embodiments, each of the light emitting layers 110, 210, 310 may comprise two semiconductor layers of different conductive types (e.g., P-type and N-type), and a quantum well layer between the two different type semiconductor layers. In some embodiments, the light emitting layers 110, 210, 310 may each have a P-type semiconductor layer at the bottom and an N-type semiconductor layer at the top. In some other embodiments, the light emitting layers 110, 210, 310 each may have an N-type semiconductor layer at the bottom and a P-type semiconductor layer at the top.

In some embodiments, the conductive layer may be transparent or opaque. In some embodiments, the material of the conductive bonding layer is selected from one of a metal, a composite metal, or a transparent conductive material. In some embodiments, the transparent conductive material may be made of transparent plastic (resin) or silicon dioxide ($SiO_2$), e.g., spin-on glass (SOG), bonding adhesive Micro Resist BCL-1200, etc. The metal may be selected from copper (Cu), gold (Au), etc. In some embodiments, the thickness of the conductive bonding layer can range from about 0.1 micron to about 5 microns. In some embodiments, metal compositions for the bonding layers may include Au—Au bonding, Au—Sn bonding, Au—In bonding, Ti—Ti bonding, Cu—Cu bonding, or a combination thereof. For example, when Au—Au bonding is needed, the two layers of Au each need a chrome (Cr) coating as an adhesive layer, and platinum (Pt) coating between the gold layer and the chrome coating as an anti-diffusion layer. The Cr and Pt layers may be formed on both Au layers to be bonded. In some embodiments, when the thicknesses of the two Au layers to be bonded are about the same, the mutual diffusion of Au on both Au layers may bond the two layers together under high pressure and high temperature. Example bonding techniques may include eutectic bonding, thermal compression bonding, and transient liquid phase (TLP).

In some embodiments, the dielectric layers (e.g., 410, 420) may be $SiO_2$—$SiO_2$ bonding layers. The $SiO_2$—$SiO_2$ bonding may further reduce the thickness of the bonding layers while achieving a higher bond strength.

In some embodiments, the material of the conductive layers (e.g.,) may be selected from a transparent conductive material. In some embodiments, the transparent conductive material may be transparent conductive oxide (TCO), e.g., indium tin oxide (ITO), aluminum-doped zinc oxide (AZO), antimony-doped tin oxide (ATO), or fluorine-doped tin oxide (FTO). In some embodiments, the thickness of the ITO layer can range from about 0.01 micron to about 1 micron.

In some exemplary embodiments, the light emitting layer 110 in the micro LED structure 10 is designed to emit red light. Examples of a red light emitting layer include III-V nitride, III-V arsenide, III-V phosphide, and III-V antimonide epitaxial structures. In some embodiments, films within the red light emitting layer may include layers of P-type (Al)(In)(Ga)P, (Al) INGaP light emitting layer, N-type (Al)(In)(Ga)P, or N-type GaAs. In some embodiments, P-type may be Mg-doped or C-doped, and N-type may be Si-doped. In some embodiments, the thickness of the light emitting layer 110 may range from about 0.3 micron to about 5 microns.

In some embodiments, the light emitting layer 210 in the micro LED structure 10 is designed to emit green light. Examples of a green light emitting layer include III-V nitride, III-V arsenide, III-V phosphide, and III-V antimonide epitaxial structures. In some embodiments, films within the green light emitting layer 210 may include the layers of P-type GaN/InGaN light-emitting layer/N-type GaN. In some embodiments, P-type may be Mg-doped, and N-type may be Si-doped. In some embodiments, the thickness of the light emitting layer 210 may range from about 0.3 micron to about 5 microns.

In some embodiments, the light emitting layer 310 in the micro LED structure 10 is designed to emit blue light. Examples of a blue light emitting layer include III-V nitride, III-V arsenide, III-V phosphide, and III-V antimonide epitaxial structures. In some embodiments, films within the blue light emitting layer 310 may include the layers of P-type GaN, InGaN light-emitting layer, or N-type GaN. In some embodiments, P-type may be Mg-doped, and N-type may be Si-doped. In some embodiments, the thickness of the blue light emitting layer 310 may range from about 0.3 micron to about 5 microns.

In some embodiments, in the micro LED structure 10, the top conductive layer 430 on the very top of the micro-LED structure is deposited on the light emitting layer 310. In some embodiments, the thickness of the final connecting layer 430 (ITO layer) may be from about 0.01 micron to about 1 micron.

In some embodiments, a micro lens 900 may be formed on top of a micro LED structure 10.

Figure 3:
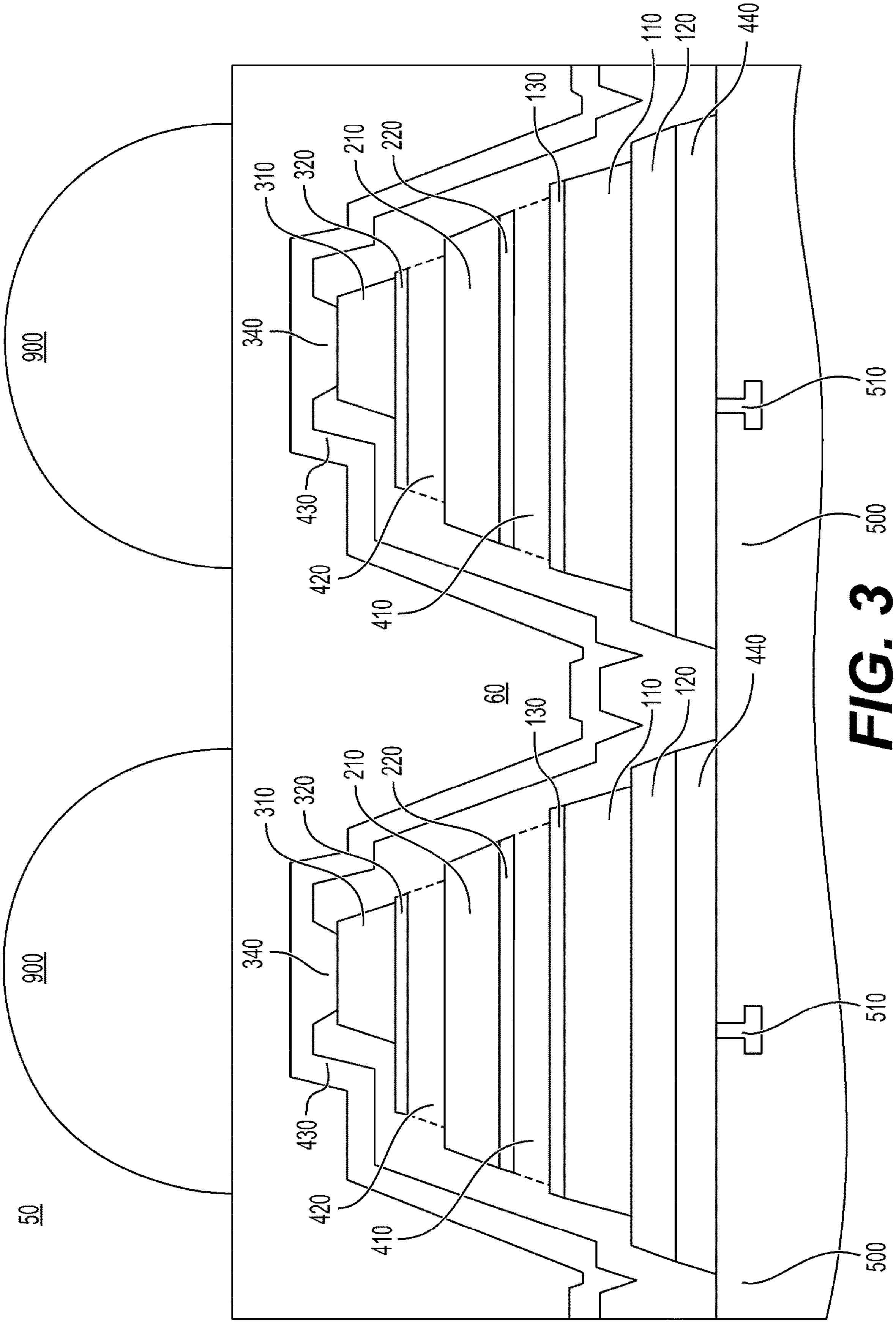
FIG. 3 is a cross sectional view of an exemplary micro LED panel, according to some embodiments of the present disclosure.

In some embodiments, as shown in FIG. 3, multiple micro LED structures 10 may be aligned to be a micro LED array. In some embodiments, the final conductive layers 430 of each of the plurality of the micro LED structures 10 are connected. In some embodiments, the connected final conductive layers 430 of each of the plurality of the micro LED structures 10 may form trenches 60 between adjacent micro LED structures 10. The formed trenches 60 between adjacent micro LED structures 10 may provide current management benefits for micro LED structure protections.

In some embodiments, a bottom of the trenches 60 is level with or lower than a top surface of the first light emitting layer 110, i.e., not higher than the top surface of the first light emitting layer 110.

The micro LEDs described in the disclosed embodiments have a very small size in volume. The micro LED may be an organic LED or an inorganic LED. In some embodiments, the micro LED may be applied in a micro LED array panel. The light emitting area of the micro LED array panel may be very small, e.g., 1 mm×1 mm, 3 mm×5 mm, etc. In some embodiments, the light emitting area may be the area of the micro LED array in the micro LED array panel. The micro LED array panel may include one or more micro LED arrays, which form a pixel array in which the micro LEDs are pixels, e.g., a 1600×1200, 680×480, or 1920×1080 pixel array. The diameter of the micro LED may be in the range of about 100 nm to 20 μm, about 150 nm to 10 μm, or about 200 nm to 2 μm. In some embodiments, an IC backplane may be formed at the back surface of the micro LED array and electrically connected to the micro LED array. In some embodiments, the IC backplane may acquire signals, such as, for example, image data from outside via signal lines, to control the on/off of the corresponding micro LEDs (e.g., emitting light or not).

Accordingly, different types of display panels may be fabricated. For example, in some embodiments, the resolution of a display panel may range from 8×8 to 3840×2160. Common display resolutions include QVGA with 320×240 resolution and an aspect ratio of 4:3, XGA with 1024×768 resolution and an aspect ratio of 4:3, D with 1280×720 resolution and an aspect ratio of 16:9, FHD with 1920×1080 resolution and an aspect ratio of 16:9, UHD with 3840×2160 resolution and an aspect ratio of 16:9, and 4K with 4096×2160 resolution and an aspect ratio of 1.9. There can also be a wide variety of pixel sizes, ranging from sub-micron and below to 10 mm and above. The size of the overall display region can also vary widely, ranging from diagonals as small as tens of microns or less up to hundreds of inches or more.

It is understood by those skilled in the art that, the micro LED display panel is not limited by the structure mentioned above, and may include more or less components than those as illustrated, or some components may be combined, or a different component may be utilized.

It should be noted that, the relational terms herein such as "first" and "second" are used only to differentiate an entity or operation from another entity or operation, and do not require or imply any actual relationship or sequence between these entities or operations. Moreover, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

It is understood by those skilled in the art that, all or part of the steps for implementing the foregoing embodiments may be implemented by hardware or may be implemented by a program that instructs related hardware. The program may be stored in the aforementioned flash memory, in the aforementioned conventional computer device, in the aforementioned central processing module, in the aforementioned adjustment module, etc.

The above descriptions are merely embodiments of the present disclosure, and the present disclosure is not limited thereto. A modifications, equivalent substitutions and improvements made without departing from the conception and principle of the present disclosure shall fall within the protection scope of the present disclosure.

The invention claimed is:

1. A micro light-emitting diode (LED) structure, comprising:
- an integrated-circuit (IC) back plane comprising at least a first conductive pad, a second conductive pad, and a third conductive pad;
- at least three mesa structures stacked along a vertical axis, the at least three mesa structures comprising:
  - a first mesa structure formed on the IC back plane;
  - a second mesa structure formed on the first mesa structure; and
  - a third mesa structure formed on the second mesa structure; and
- a first dielectric layer formed between the first mesa structure and the second mesa structure;
- a second dielectric layer formed between the second mesa structure and the third mesa structure; and
- a final conductive layer;
- wherein:
  - the first mesa structure comprises:
    - a first light emitting layer comprising at least one cut-out;
    - a first bottom conductive layer formed under the first light emitting layer, the first bottom conductive layer comprising at least one cut-out;
    - a first top conductive layer formed on the first light emitting layer, the first top conductive layer comprising at least one cut-out; and
    - a first top-contact electrically connected to the first light emitting layer;
  - the second mesa structure comprises:
    - a second light emitting layer comprising at least one cut-out;
    - a second bottom conductive layer formed under the first light emitting layer, the second bottom conductive layer comprising at least one cut-out; and
    - a second top-contact electrically connected to the second light emitting layer;
  - the third mesa structure comprises:
    - a third light emitting layer;
    - a third bottom conductive layer formed under the first light emitting layer, the third bottom conductive layer comprising at least one cut-out; and
    - a third top-contact electrically connected to the third light emitting layer;
  - the first conductive pad is electrically connected with the first bottom conductive layer,
  - the second conductive pad is electrically connected with the second bottom conductive layer through a first via;
  - the third conductive pad is electrically connected with the third bottom conductive layer through a second via;
  - the final conductive layer is electrically connected with the first, second, and third top-contacts.

2. The micro LED structure of claim 1, wherein the second mesa structure further comprises:
- a second top conductive layer formed on the second light emitting layer, the second top conductive layer comprising at least one cut-out;
- wherein the second top-contact electrically connects the second light emitting layer to the final conductive layer through the second top conductive layer.

3. The micro LED structure of claim 1, wherein the third mesa structure further comprises:
- a third top conductive layer formed on the third light emitting layer;
- wherein the third top-contact electrically connects the third light emitting layer to the final conductive layer through the third top conductive layer.

4. The micro LED structure of claim 1, wherein each of:
- the third bottom conductive layer,
- the second light emitting layer,
- the second bottom conductive layer,
- the first top conductive layer,
- the first light emitting layer, and
- the first bottom conductive layer comprises a cut-out aligned with the first via.

5. The micro LED structure of claim 1, wherein a cut-out of the second light emitting layer is aligned with a cut-out of the second bottom conductive layer.

6. The micro LED structure of claim 1, comprising a first layer and a second layer selected from:
- the first bottom conductive layer,
- the first light emitting layer,
- the first top conductive layer,
- the second bottom conductive layer,
- the second light emitting layer,
- the third bottom conductive layer, and
- the third light emitting layer, wherein the first layer is below the second layer, the first layer forms a first outline in a plan view, and the second layer forms a second outline in the plan view, the second outline being disposed within the first outline.

7. The micro LED structure of claim 1, wherein each of the first dielectric layer, the second bottom conductive layer, the second light emitting layer, the second dielectric layer, the third bottom conductive layer, and the third light emitting layer comprises a sidewall that is aligned to a substantially straight line in a side view, the substantially straight line being inclined at a first angle.

8. The micro LED structure of claim 7, wherein, in the side view, each of the first via and second via is separated by a same distance from at least one sidewall of the first dielectric layer, the second bottom conductive layer, the second light emitting layer, the second dielectric layer, the third bottom conductive layer, or the third light emitting layer.

9. The micro LED structure of claim 1, wherein sidewalls of the first dielectric layer, the second bottom conductive layer, the second light emitting layer, the second dielectric layer, the third bottom conductive layer, and the third light emitting layer are all inclined.

10. The micro LED structure of claim 1, further comprising a bottom bonding layer bonding the first mesa structure to the first pad.

11. The micro LED structure of claim 1, wherein each of the first, second, and third light emitting layers comprises a P-type epitaxial layer, a light emitting layer and an N-type epitaxial layer.

12. The micro LED structure of claim 1, wherein each of the first, second, and third light emitting layers is a quantum well layer.

13. The micro LED structure of claim 1, wherein the first dielectric layer, the second dielectric layer, the first bottom conductive layer, the first top conductive layer, and the third bottom conductive layer are all transparent.

14. The micro LED structure of claim 1, wherein the first dielectric layer and the second dielectric layer are made of silicon dioxide ($SiO_2$), silicon mononitride (SiN), silicon oxynitride (SiON), silicon carbon nitride (SiCN), titanium dioxide (TiO2), or aluminum oxide (Al2O3).

15. The micro LED structure of claim 1, wherein the first bottom conductive layer, the first top conductive layer, the second bottom conductive layer, the third bottom conductive layer, and the final conductive layer are made of indium tin oxide (ITO), aluminum-doped zinc oxide (AZO), antimony-doped tin oxide (ATO), or fluorine-doped tin oxide (FTO).

16. The micro LED structure of claim 1, wherein each of the first, second, and third top-contacts is an N-type contact or a P-type contact.

17. A micro LED array comprising a plurality of the micro LED structures of claim 1, wherein the final conductive layers of the plurality of the micro LED structures are connected.

18. The micro LED array of claim 17, wherein the connected final conductive layers form trenches between adjacent micro LED structures of the plurality of the micro LED structures.

19. The micro LED array of claim 18, wherein a bottom of the trenches is leveled with or lower than a top surface of the first light emitting layers of the plurality of the micro LED structures.

20. The micro LED structure of claim 1, wherein the first light emitting layer emits red light.

21. The micro LED structure of claim 1, wherein the third light emitting layer emits green light.

22. The micro LED structure of claim 17, wherein the first light emitting layer emits red light.

23. The micro LED structure of claim 17, wherein the third light emitting layer emits green light.

* * * * *